(12) United States Patent
Thacker et al.

(10) Patent No.: US 12,112,823 B2
(45) Date of Patent: Oct. 8, 2024

(54) METHOD AND SYSTEM FOR REPAIRING FAULTY CELLS OF MEMORY DEVICE

(71) Applicant: SAMSUNG ELECTRONICS CO., LTD., Suwon-si (KR)

(72) Inventors: Helik Kanti Thacker, Bengaluru (IN); Adrita Barari, Bengaluru (IN); Ankit Gupta, Bengaluru (IN); Atishay Kumar, Bengaluru (IN); Deokgu Yoon, Suwon-si (KR); Damini, Bengaluru (IN); Keerthi Kiran Jagannathachar, Bengaluru (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 141 days.

(21) Appl. No.: 17/858,745

(22) Filed: Jul. 6, 2022

(65) Prior Publication Data
US 2023/0019575 A1    Jan. 19, 2023

(30) Foreign Application Priority Data

Jul. 6, 2021   (IN) .............................. 202141030374

(51) Int. Cl.
*G11C 29/00*   (2006.01)
*G06N 3/063*   (2023.01)

(52) U.S. Cl.
CPC ........... *G11C 29/789* (2013.01); *G06N 3/063* (2013.01); *G11C 29/702* (2013.01)

(58) Field of Classification Search
CPC ........ G11C 29/789; G11C 29/78; G11C 29/00

USPC .................................................... 365/189.05
See application file for complete search history.

(56) References Cited

U.S. PATENT DOCUMENTS

| 9,626,244 B2* | 4/2017 | Sohn ....................... G11C 29/44 |
| 10,546,649 B2* | 1/2020 | Pope ....................... G11C 29/44 |
| 10,891,185 B2* | 1/2021 | Warnes .................... G11C 29/44 |
| 2012/0131396 A1* | 5/2012 | Jeong ....................... G11C 29/72 |
| | | 714/718 |

OTHER PUBLICATIONS

Günther, Frauke, and Stefan Fritsch. "Neuralnet: training of neural networks." R J. 2.1 (2010): 30.*

* cited by examiner

*Primary Examiner* — Muna A Techane
(74) *Attorney, Agent, or Firm* — Sughrue Mion, PLLC

(57) ABSTRACT

A method for repairing a memory device with faulty memory cells. The method includes defining a RA environment comprising a location of each of the faulty memory cells and a plurality of SR and a plurality of SC. The method further includes repairing the faulty memory cells based on an RA training process using the defined RA environment and mapping of the location of each faulty memory cell with the plurality of SC or SR. The method further includes training, based on a determination that indicates the at least one faulty memory cell among the faulty memory cells is left unrepaired and the at least one SC or SR is remaining, a first NN to perform an action for repairing of the faulty memory cells such that a maximum number of faulty memory cells are reparable and a minimum number of SC and SR are utilized during the repairing.

13 Claims, 10 Drawing Sheets

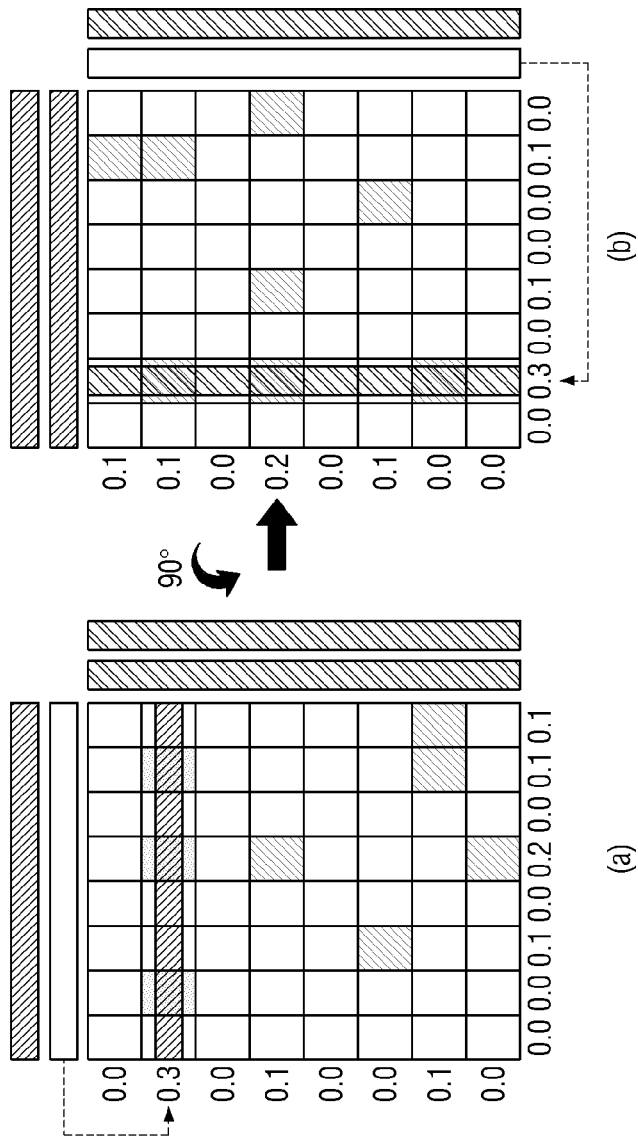

METHOD AND SYSTEM FOR REPAIRING FAULTY CELLS OF MEMORY DEVICE

CROSS-REFERENCE TO RELATED APPLICATIONS

This application is based on and claims priority from Indian Patent Application No. 202141030374, filed on Jul. 6, 2021, and Indian Patent Application No. 202141030374, filed on Jul. 5, 2022, in the Indian Patent Office, the disclosures of which are incorporated herein in their entireties by reference.

FIELD OF THE INVENTION

The present disclosure in general, relates to dynamic random-access memory (DRAM). In particular, but not exclusively, the present disclosure relates to a method and system for repairing faulty cells of a memory device using AlphaZero based approach.

BACKGROUND

The industry of semiconductor manufacturing has seen a rapid surge due to advancement in semiconductor technology. In order to meet the increasing demand of semiconductors, the leading producers are manufacturing them in huge amounts on a single wafer. The manufacturers have also increased densities of memory and decreased the node sizes in semiconductor devices considering the Moore's Law due to which the probability of defects in memory has increased and wafer yields have decreased. During the fabrication process, there are several environmental factors that can cause errors in the wafer such as undesired chemical and airborne particles deposited on the chip during various manufacturing phases, despite of using dust-free clean rooms and extremely precise equipment. Some of these errors cannot be avoided, and it leads to defected chips in wafer, which eventually reduces the wafer yield.

With increasing DRAM densities, the probability of memory defects on semiconductor chips have increased. This means that there are more errors on the DRAM device as newer devices will come into the market. To repair faulty memory cells, redundancies are included in the form of spare rows (SR) and spare columns (SC) in the memory. The process of allocating spare rows and columns to the defective address location in the chip during wafer tests is called Redundancy Analysis (RA). As an example of a process of allocating spare rows and columns to the defective address location is illustrated in FIG. 1 of the drawings, according to an existing art. As can be seen from the FIG. 1, 101 represents a faulty memory cells or failed bits. Further, 103 represents SC and 105 represents SR. During the repair of faults, spares are used to substitute entire faulty row or column. At runtime, the spare row or column is accessed internally instead of accessing the defective row or column address.

Further, including the redundancies on the chip and using them to repair defects in chip enhances the yield of memory. However, RA is a Nondeterministic Polynomial-time (NP) complete problem. Thus, with increasing faulty cells, the time required to deterministically find a solution grows exponentially in the worst case. If the chip is unrepairable, it either means it has huge number of defects or the distribution of faults are such that it is non-repairable by allotted redundancies. Such unrepairable chips are deemed unusable.

The existing research is focused on either heuristic or exhaustive Redundancy Analysis (RA) algorithms. Heuristic RA algorithms such as Broadside, Repair-Most, Largest Effective Coefficient Algorithm (LECA), One Side Pivot algorithm (OSP) and FAST have lower runtime but also have low repair rates. On the other hand, exhaustive RA algorithms, such as Faulty Line Covering Algorithm (FLCA), Branch-and-Bound and PAGEB achieve optimal repair rates but with exponential time complexities, making them infeasible to be used on the manufacturing line.

To make a repair viable, optimal RA algorithm should be selected which considers both, the yield and time complexities of repair. An exhaustive search algorithm like Branch-and-Bound, PAGEB and fault-driven algorithms will be able to find a repair solution whenever one exists. Exhaustive nature of the algorithms makes it reach the most optimal repair rate possible. However, with the increased number of errors, the space and time complexity of algorithm increases exponentially which makes it infeasible to use in wafers with high error count. Heuristic algorithms like Repair-Most and One Side Pivot (OSP) have been proposed which are capable of finding the repair solution quickly, but their disadvantage being that they are not able to achieve an optimal repair rate.

The Broadside Algorithm uses a greedy approach to perform a repair. It assigns a spare row or column based on whichever is present in excess when it repairs an error. In case of same number of spare row and column, assignment is based on the algorithm design and device requirement. Broadside performs faster repair compared to other algorithms, but the yield is very low.

In an exponential Fault Driven Comprehensive Algorithm (FDCA), a full solution tree tries all possible combinations of spare rows and columns to repair an error and generates all possible solutions. In a Faulty Line Covering Algorithm (FLCA) which is based on the principal that a faulty row with 'k' faults can be covered either by a spare row or k spare columns. This eliminates branches with parents as faults which have already been repaired. However, the time taken by the FLCA to execute is exponential. Thus, it may take a long time to repair a chip, which impractical in the manufacturing line.

Largest Effective Coefficient Algorithm (LECA) is an algorithm that uses Effective Coefficients (EC) to rank the rows and columns of a chip in the order of repair. The EC considers both fault counters and complements of a faulty line. LECA is more applicable in random fixed sized die rather than random faulty bits distribution where effective coefficients have less significance.

Further, OSP algorithm uses pivot fault properties to find repair priorities reducing the analysis time even when the error is high. The faults are classified into three different types i.e., pivot faults, intersection faults, and OSP faults. An example representation of the different types of faults is also shown in FIG. 2 of the drawings, according to an existing art. While a pivot fault is defined as a fault in a faulty line that is not included in any other faulty lines, an intersection fault is defined as a fault that is included in both faulty column and faulty row. OSP fault is defined as a pivot fault, which is not included in a faulty line that does not have an intersection fault. Row OSP faults (pivot in its column) will be solved using spare rows and column OSP faults (pivot in its row) will be solved using spare column. To repair pivot faults, if fault is pivot in its row, it is solved using spare column and vice versa. Thus, the time taken to find a solution by the OSP algorithm is less, but it does not take into account the subarray structure of the memory.

Therefore, the aforementioned existing algorithms have certain limitations as discussed hereinabove. Accordingly, there lies a need for a method and system that can perform an efficient RA for repairing the faulty cells of the memory device.

SUMMARY

This summary is provided to introduce a selection of concepts in a simplified format that are further described in the detailed description of the invention. This summary is not intended to identify key or essential inventive concepts of the invention, nor is it intended for determining the scope of the invention.

In an implementation, the present subject matter refers to a method for repairing a memory device. The method includes detecting one or more faulty memory cells that are faulty in a memory device and a location corresponding to the each of one or more faulty memory cells, and defining a Redundancy Analysis (RA) environment, comprising the detected location of the each of one or more faulty memory cells and a plurality of spare row (SR) and a plurality of spare column (SC), for repairing the memory device. The method further includes repairing each of the one or more faulty memory cells based on an RA training process using the defined RA environment and mapping of the detected location of each of the faulty memory cells with the plurality of SC or SR and determining whether at least one faulty memory cell among the one or more faulty memory cells is left unrepaired after the repairing of the one or more faulty memory cells. Thereafter, the method includes determining whether any SC or SR among the plurality of SC or SR is remaining based on the determination that the least one of faulty memory cell among the one or more faulty memory cells is left unrepaired. Subsequent to the determination of whether the at least one faulty memory cell is left unrepaired and of whether any SC or SR is remaining, the method further includes training, based on the determination that indicates the at least one faulty memory cell is left unrepaired and the at least one SC or SR is remaining, a first NN such that the first NN performs an action for repairing of the faulty memory cells. The action is performed such that a maximum number of faulty memory cells is reparable and a minimum number of SC and SR are utilized during the repairing.

In yet another implementation, the present subject matter refers to a system for repairing a memory device. The system includes one or more processors and a memory that includes one or more faulty memory cells. The one or more processors are configured to detect one or more faulty memory cells that are faulty in a memory device and a location corresponding to the each of one or more faulty memory cells, and define a Redundancy Analysis (RA) environment comprising the detected location of the each of one or more faulty memory cells and a plurality of spare row (SR) and a plurality of spare column (SC) for repairing the memory device. The one or more processors are further configured to repair each of the one or more faulty memory cells based on an RA training process using the defined RA environment and mapping of the detected location of each of the faulty memory cells with the plurality of SC or SR. The one or more processors are further configured to determine whether at least one faulty memory cell among the one or more faulty memory cells is left unrepaired after the repairing of the one or more faulty memory cells, and determine whether any SC or SR among the plurality of SC or SR is remaining based on the determination that the least one faulty memory cell among the one or more memory faulty cells is left unrepaired. The method further includes training, based on the determination that indicates the at least one of faulty memory cell is left unrepaired and at least one SC or SR is remaining, a first NN such that the first NN performs an action for repairing of the faulty memory cells. The action is performed such that a maximum number of faulty memory cells is reparable and a minimum number of SC and SR are utilized during the repairing.

To further clarify the advantages and features of the present invention, a more particular description of the invention will be rendered by reference to specific embodiments thereof, which is illustrated in the appended drawing. It is appreciated that these drawings depict only typical embodiments of the invention and are therefore not to be considered limiting its scope. The invention will be described and explained with additional specificity and detail with the accompanying drawings.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein:

FIG. 9A illustrates an example of the rotation operation, according to an embodiment of the present disclosure;

Figure 1:
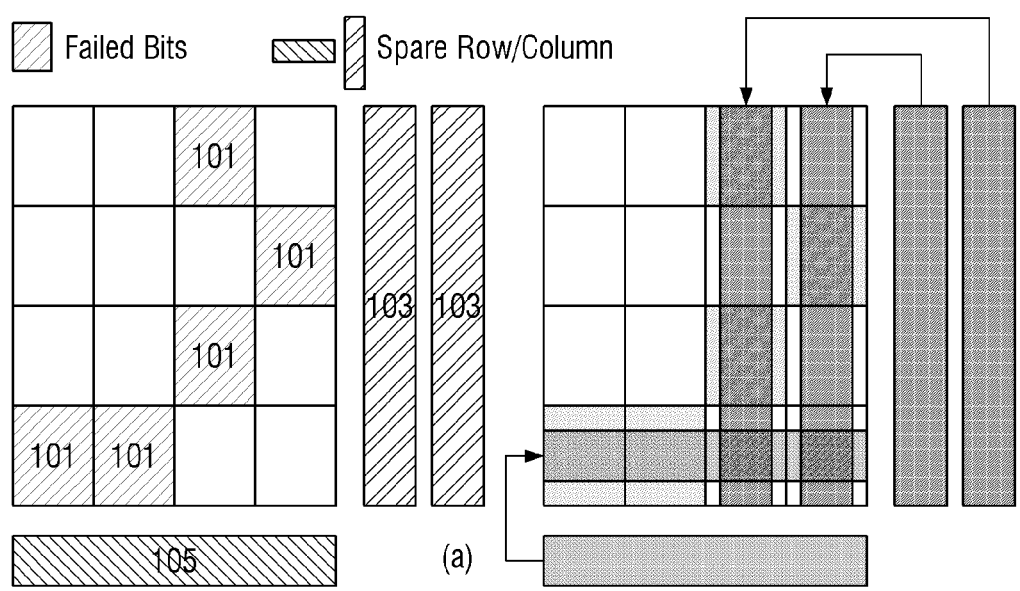
FIG. 1 is an example diagram illustrating an example of a process of allocating spare rows and columns to the defective address location, in accordance with an existing solution.

Further, skilled artisans will appreciate that elements in the drawings are illustrated for simplicity and may not have necessarily been drawn to scale. For example, the flow charts illustrate the method in terms of the most prominent steps involved to help to improve understanding of aspects of the present invention. Furthermore, in terms of the construction of the device, one or more components of the device may have been represented in the drawings by conventional symbols, and the drawings may show only those specific details that are pertinent to understanding the embodiments of the present invention so as not to obscure the drawings with details that will be readily apparent to those of ordinary skill in the art having the benefit of the description herein.

DETAILED DESCRIPTION

It should be understood at the outset that although illustrative implementations of the embodiments of the present disclosure are illustrated below, the present invention may be implemented using any number of techniques, whether currently known or in existence. The present disclosure should in no way be limited to the illustrative implementations, drawings, and techniques illustrated below, including the exemplary design and implementation illustrated and described herein, but may be modified within the scope of the appended claims along with their full scope of equivalents.

The term "some" as used herein is defined as "none, or one, or more than one, or all." Accordingly, the terms "none," "one," "more than one," "more than one, but not all" or "all" would all fall under the definition of "some." The term "some embodiments" may refer to no embodiments or one embodiment or several embodiments or all embodiments. Accordingly, the term "some embodiments" is defined as meaning "one embodiment, or more than one embodiment, or all embodiments."

The terminology and structure employed herein are for describing, teaching, and illuminating some embodiments and their specific features and elements and do not limit, restrict, or reduce the spirit and scope of the claims or their equivalents.

More specifically, any terms used herein such as but not limited to "includes," "comprises," "has," "have," and grammatical variants thereof do NOT specify an exact limitation or restriction and certainly do NOT exclude the possible addition of one or more features or elements, unless otherwise stated, and must NOT be taken to exclude the possible removal of one or more of the listed features and elements, unless otherwise stated with the limiting language "MUST comprise" or "NEEDS TO include."

Whether or not a certain feature or element was limited to being used only once, either way, it may still be referred to as "one or more features" or "one or more elements" or "at least one feature" or "at least one element." Furthermore, the use of the terms "one or more" or "at least one" "a plurality of" feature or element do NOT preclude there being none of that feature or element unless otherwise specified by limiting language such as "there NEEDS to be one or more . . . " or "one or more element is REQUIRED."

Unless otherwise defined, all terms, and especially any technical and/or scientific terms, used herein may be taken to have the same meaning as commonly understood by one having ordinary skill in the art.

Embodiments of the present invention will be described below in detail with reference to the accompanying drawings.

According to the disclosed RA approach i.e. AlphaRA, based on the Reinforcement Learning (RL) Method AlphaZero. According to an environment the AlphaRA agent learns from its environment by combining Monte Carlo Tree Search (MCTS) and Deep Neural Networks (DNN) iteratively for policy evaluation and improvement. Through a self-play process over many episodes, the AlphaRA agent learns a policy to achieve a high yield which is measured in terms of repair rate of the chips. According to the embodiment, the AlphaRA agent may includes a Neural Network (NN). Further, the AlphaRA agent may be alternatively referred as agent through out the disclosure without deviating from the scope of the disclosure. The motivation for exploring a Reinforcement Learning (RL) approach for RA is driven by the fact that RL allows the agent to self-discover unconventional strategies, without requiring insights into fault patterns and the agent learns to repair the chip without any design insights or handcrafted rules.

Figure 3:
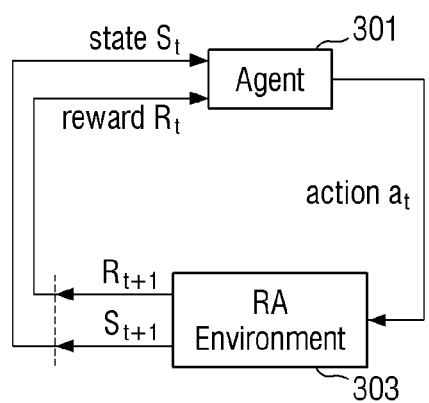
FIG. 3 illustrates an agent action and reward function during a repairing process, according to an embodiment of the present disclosure.

According to an embodiment, the approach of modeling the RA problem is as a Markov Decision Process (MDP). The methodology to use a deep neural network to guide the MCTS search in order to repair a memory without any prior domain knowledge is unique. Further, the process of choosing a best trained neural network (NN) by comparing spare row or column utilization and maximum number of chips repaired by the NN yields a maximum efficiency. Further, the RA is a process of allocating spare rows (SR) and spare columns (SC) to a defective addresses or location in the chips. FIG. 3 illustrates an agent action and reward function during a repairing process, according to an embodiment of the present disclosure. The agent 301 takes an action at an environment state $S_t$ by a RA environment 303. The agent 301 receives a reward $R_t$ for the performed actions. It then learns to perform the task by taking a sequence of actions, which maximizes its cumulative rewards, without any guidance on how to perform the task. A detailed process of the same will be explained in the forthcoming paragraphs. This helps in discovery of previously unseen strategies, which may not have been covered by design insights or rules. A process of the RA will be explained in detailed in the forthcoming paragraphs.

Figure 4:
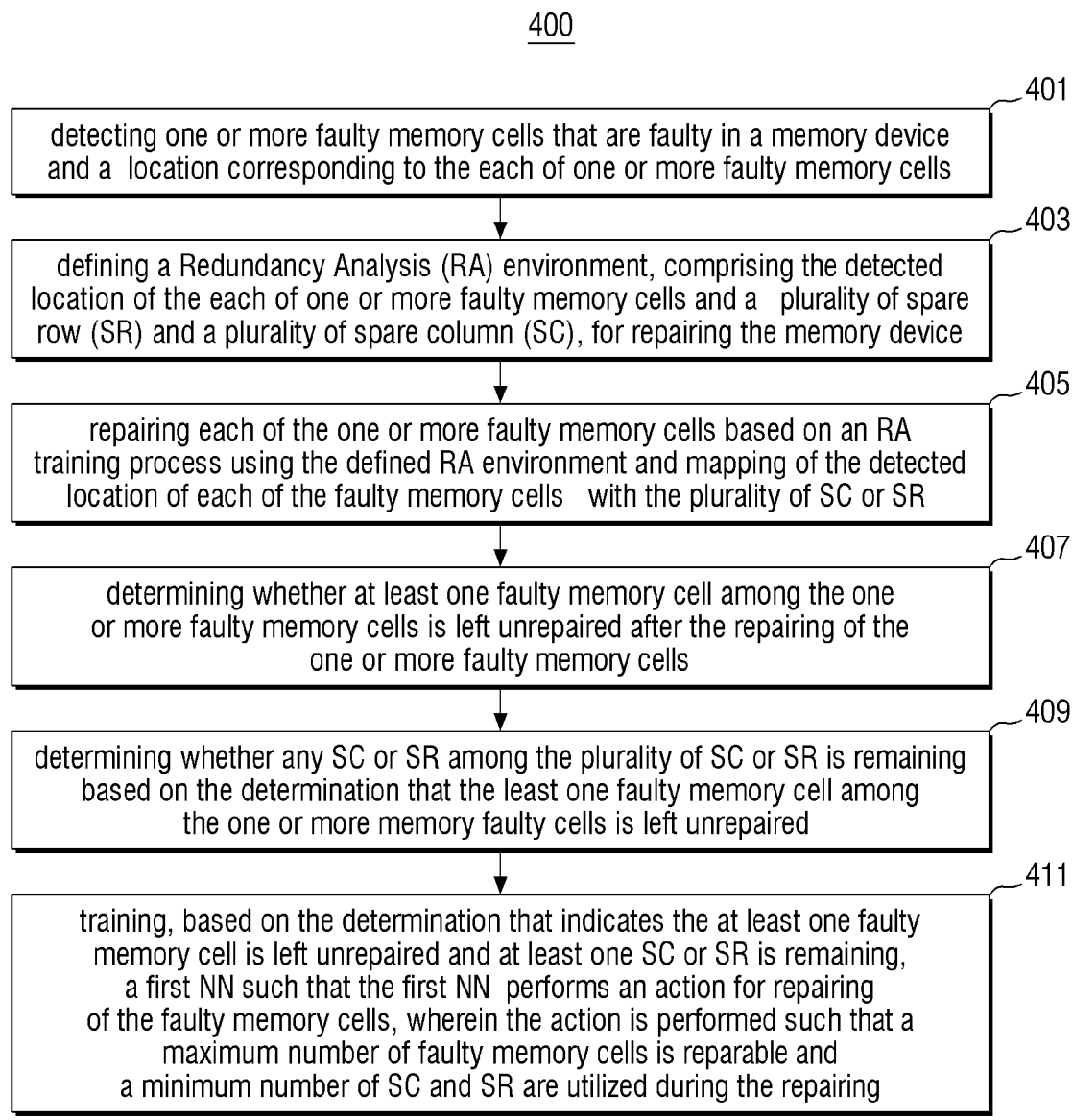
FIG. 4 illustrates a flowchart of method steps for repairing a memory device, in accordance with an embodiment of the present disclosure.
Figure 10:
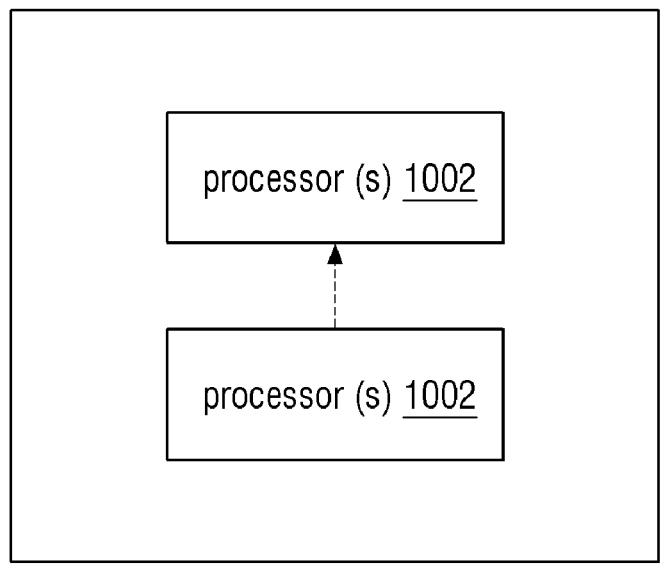
FIG. 10 is a diagram illustrating the configuration of a hardware system 1000, according to an embodiment of the present disclosure.

FIG. 4 illustrates a flowchart of method steps for repairing a memory device, in accordance with an embodiment of the present disclosure. FIG. 4 depicts a method 400 that is executed by one or more processors of FIG. 10 illustrating a system hardware. The detailed description of the method steps of the method 400 will now be made with reference to FIGS. 5 through 8 of the drawings. The one or more processors 102 may be configured to perform the method 400 through the steps as shown in the FIG. 4. Further, the reference numerals have been kept same wherever applicable for the ease of explanation throughout the disclosure.

Figure 5:
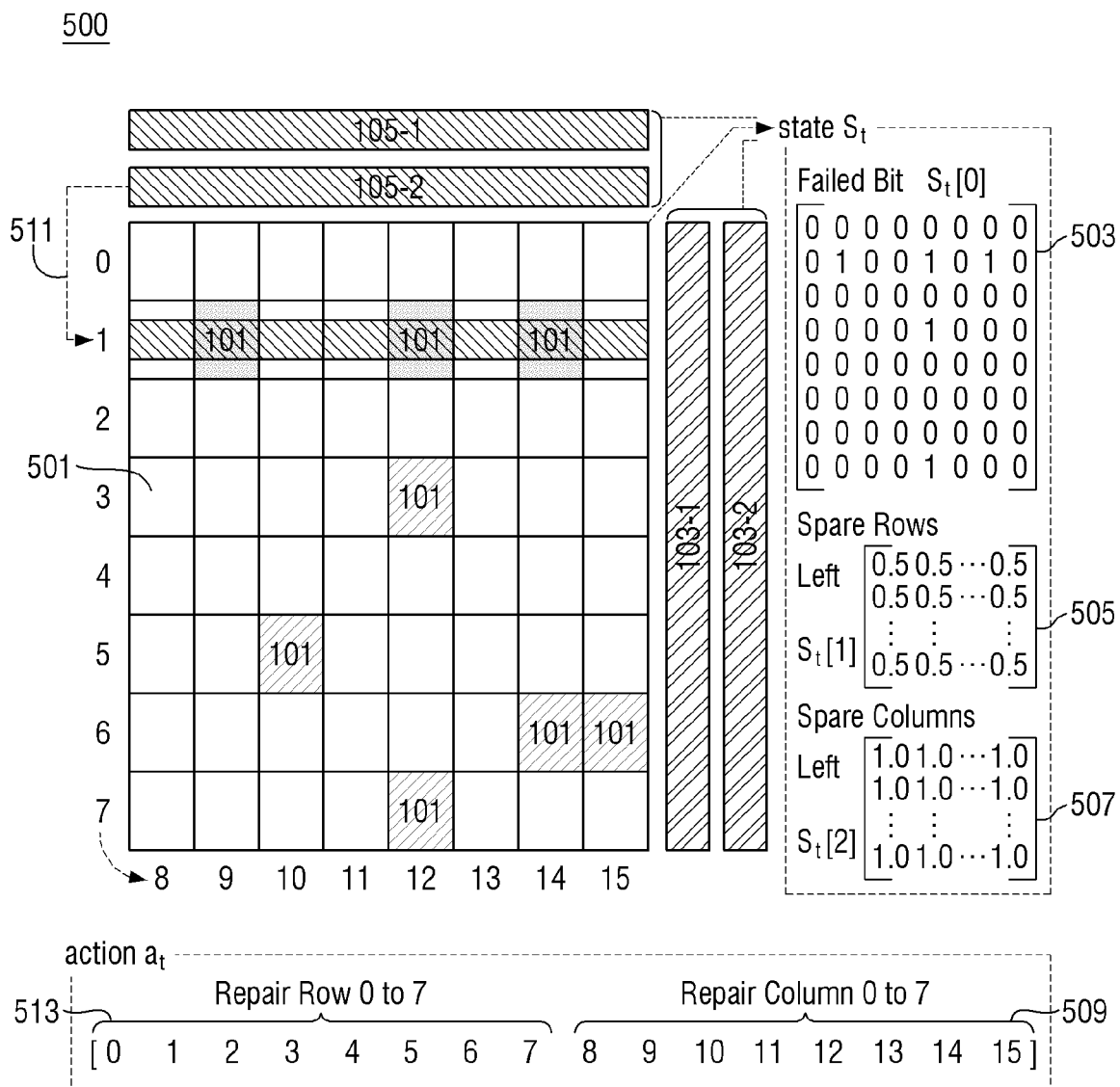
FIG. 5 illustrates an example of a memory chip that is represented by a 2D matrix, in accordance with an embodiment of the present disclosure.

The method 400 as depicted in FIG. 4, at step 401, initially comprises detecting one or more faulty memory cells that are faulty in a memory device and a location corresponding to the each of one or more faulty memory cells. As an example, a Cold and Hot wafer tests may be performed to locate an exact address of the faulty memory cells. FIG. 5 illustrates an initial state representation of a memory chip with the spares row (SR) and the spare column (SC), according to an embodiment of the present disclosure. As can be seen from the FIG. 5, the memory chip 500 may include one or more memory cell 501. The one or more memory cell 501 may be or may not include one or more faulty cells 101. Further, the one or more memory cell 501 may include one or more spare rows (SR) 105-1, 105-2 and one or more spare columns (SC) 103-1, 103-2. The one or more spare rows 105-1, 105-2 may be collectively referred as 105 and one or more spare columns 103-1, 103-2 may be collectively referred as 103.

As an example, the flow of the method 400 now proceeds to (step 403). The step 403 includes defining a Redundancy Analysis (RA) environment. In an implementation, the RA environment 303 includes the detected location of the each of one or more faulty memory cells 101 and the one or more spare row (SR) 105 and the one or more of spare column (SC) 103, for repairing the memory chip 500. The RA environment 303 has been introduce at the FIG. 3 above. According to an embodiment, the location of the each of one or more faulty memory cells 101 is included as a RA environment as a matrices 503. Further, the one or more spare row (SR) 105 and the one or more of spare column (SC) 103 may be included as matrices 505 and 507 respectively.

At step 405, subsequent to the step 403 of the method 400 includes repairing each of the one or more faulty memory cells 101 based on an RA training process using the defined RA environment and mapping of the detected location of each of the faulty memory cells 101 with the plurality of SC 103 or SR 105.

Subsequent to the step 405, the flow of the method 400 now proceeds to (step 407). The step 407 includes determining whether at least one faulty memory cell among the one or more faulty memory cells 101 is left unrepaired after the repairing of the one or more faulty memory cells.

Thereafter, at step 409, the method 400 includes determining whether any SC 103 or SR 105 among the one or more SC or SR is remaining based on the determination that the least one faulty memory cell among the one or more memory faulty cells is left unrepaired.

Then at step 411, the method 400 includes training, based on the determination that indicates the at least one faulty memory cell is left unrepaired and at least one of SC or SR is remaining, a first NN such that the first NN performs an action for repairing of the faulty memory cells. Here the first NN is a current NN that is utilized for the training. A detailed description of training will be explained in the forthcoming paragraphs.

According to an embodiment, the determination of whether at least one faulty memory cell is left unrepaired is based on a reward returned during the repairing. In an implementation the reward is returned by the RA environment 303. Further, the performed action is based on a policy of a memory state and a memory state corresponding to the one or more faulty memory cells. Further, the reward is given based on a presence of a set of faulty memory cells among the one or more memory cells and a number of available SC or SR after the s is performed.

Accordingly, the RA environment 303 further includes rewards, the policy of the memory state and a memory state. As an example, the memory state includes the N×N matrix which has 1's (faults) and 0's (non-faulty cells). the N×N Matrix of normalized values of SR, the N×N matrix which has 1's (faults) and 0's (non-faulty cells), and N×N Matrix of normalized values of SR.

Continuing with the same embodiment, when each time the action for repairing the faulty memory cells is performed, the method 400 determines whether any SC or SR among the one or more of SC 103 or SR 105 is remaining. Thereafter, the method 400 further determines a must-repair condition is occurred for repairing the one or more faulty memory cells based on the determination that indicates an availability of any SC or SR among the plurality of SC or SR after each performed action for repairing of the faulty memory cells. In an implementation, the must repair condition for a row or a column is defined as a number of faults in a row or column exceeding an available number of SC or SR respectively.

Continuing with the same embodiment, the method 400 further includes identifying a set of memory line among the one or more faulty memory cell in a case where the number of faults in the row or column exceeds the available number.

Thus, after identifying those set of memory line where the number of faults in row or column exceeds the available number of SC or SR, then the method 400 includes masking identified the first set of faulty memory line when the must-repair condition is satisfied. As an example, the memory line includes faulty rows and faulty columns. Further, the method 400 includes masking another set of memory cells which has zero faults.

Now, in general the memory chip is represented by an N×N 2D Boolean matrix with 1 indicating a faulty cell. The action space is a vector of length 2N where the first N elements correspond to selecting rows 0 to N−1 and the next N elements correspond to selecting columns 0 to N−1 for repair. Further, for a given state s, first it is check if there are any faulty lines in must-repair condition. If so, the action set for s consists only of the faulty lines in must-repair condition. Otherwise, the action set consists of all the faulty lines in the chip. Now, when a faulty row or column is repaired, all the 1s in that line are zeroed out in s. The reward is given to AlphaRA or the NN at the end of an episode, thus the reward structure is sparse. The reward is +1 if the agent successfully repairs the chip and −1 if it fails to do so. Here, N is an integer number.

Considering an example, FIG. 5 illustrates an example of a memory chip that is represented by a 2D matrix. The RA environment 303 includes a memory state representation that includes a number of spare rows (SR) and spare columns (SC) available to it. The spare row and column matrix is initialized as a matrices initialized as all ones initially, which represents that a fraction of spares available at that time step.

For example, an 8×8 chip with 2 spare rows (SR) 105 and 2 spare columns (SC) 103 is shown in FIG. 5. Further, faulty and non-faulty cells are depicted using 1 and 0 respectively. After a spare row (SR) is used for repairing Row 1 at step 511, the spare row (SR) matrix 505 is updated to be a matrix of 0.5. Thus, at every time step, the agent 301 should pick an action ($a_t$) out of the available rows and columns to repair a faulty line of the memory chip 500. For 8×8 actions 0 to 7 is indicative of Rows 0 to 7 being selected for repair at 513, whereas Actions 8 to 15 is indicative of Columns 0 to 7 being selected at 509. Thus, the agent 301 continues to choose actions until the episode terminates which occurs if all faults have been successfully repaired or if spares have been exhausted leaving the chip unrepaired. Accordingly, the RA environment 303 may include memory state, a policy of the memory state, a policy value of the memory state, various matrices as defined above, rewards.

Figure 6:
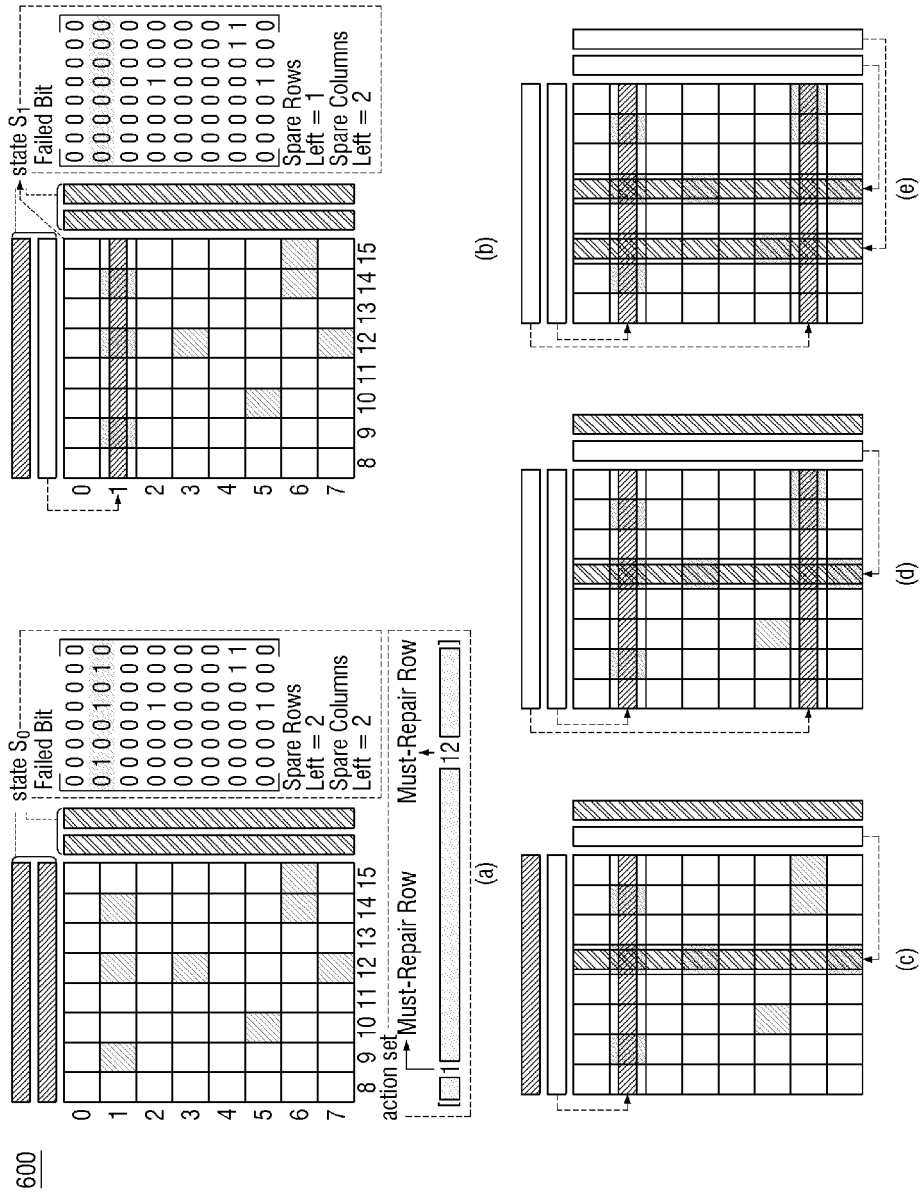
FIG. 6 illustrates an example of a memory state and an action set on an 8×8 chip with two spare rows and columns each, according to an embodiment of the present disclosure.
Figure 7:
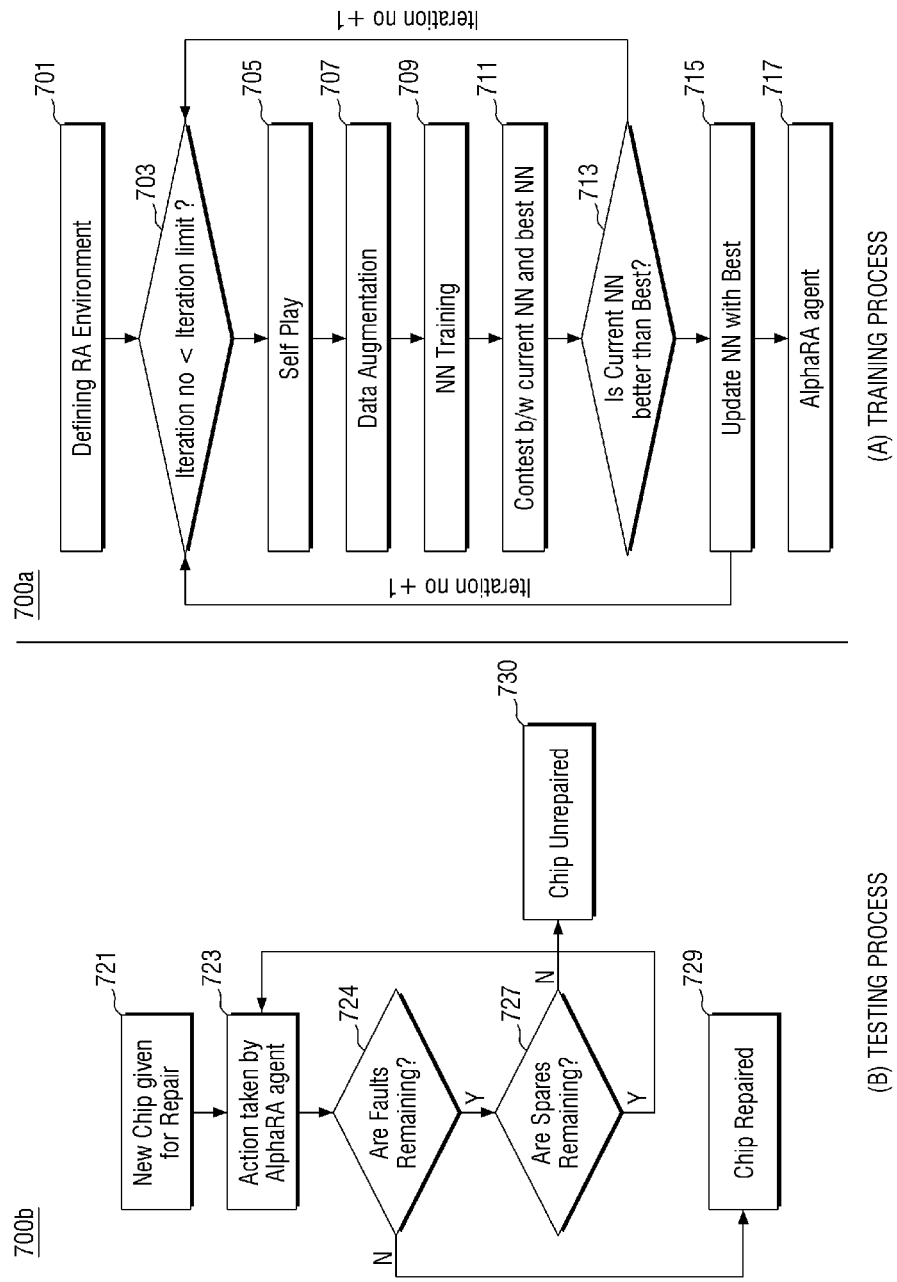
FIG. 7(A) illustrates a training process of the AlphaRA agent, according to an embodiment of the present disclosure.
FIG. 7(B) illustrates a testing process for repairing the memory device, according to an embodiment of the present disclosure.

FIG. 6 illustrates an example of a memory state and an action set on an 8×8 chip with two spare rows and columns each, according to an embodiment of the present disclosure. FIG. 6 shows an 8×8 chip 600 with two spare rows and 2 spare columns that is shown along with the initial state representation in FIG. 6(a). The action space is of length 16 with actions 0 to 7 indicative of rows 0 to 7 being selected for repair, whereas actions 8 to 15 represent columns 0 to 7 being selected. Since row 1 and column 4 are in must-repair condition, the only valid actions from s0 are 1 and 12. The agent selects action 1 in FIG. 6(a) and hence row 1 is repaired by zeroing it out as depicted in FIG. 6(b). The agent chooses actions until the episode terminates which occurs if either of the following conditions is satisfied:
i. all faults in the chip are successfully repaired,
ii. all spares are exhausted leaving the chip unrepaired.

The complete episode for the sample 8×8 chip continues from FIG. 6(c) through FIG. 6(e). Here, the agent repairs the chip in 4 time steps, using all 4 spares. The reward is given to AlphaRA at the end of an episode, thus the reward structure is sparse. The reward is +1 if the agent successfully repairs the chip and −1 if it fails to do so. According to an embodiment the agent here is the NN network that will be trained in the training process. Thus, to summarize repair process and the actions taken by the AlphaRA agent for the entire chip. Action set is 0 to 15 where actions 0 to 7 correspond to selection of Rows whereas actions 8 to 15 correspond to selection of Columns for Repair. In these Figures,
  a) Is the initial chip state with Row 1 as a must-repair row and 12 as a must-repair column, Total faults=8
  b) Action taken 1 (Row (R)), Faults remaining=5
  c) Action taken 12 (Column (C)), Faults remaining=3
  d) Action taken 6 (R), Faults remaining=1
  e) Action taken 10 (C), Faults remaining=0
  f) Chip is repaired.

FIG. 7(A) illustrates a training process of the AlphaRA agent, according to an embodiment of the present disclosure. FIG. 7(A) will be explained referring to the FIGS. 3-6.

Figure 8:
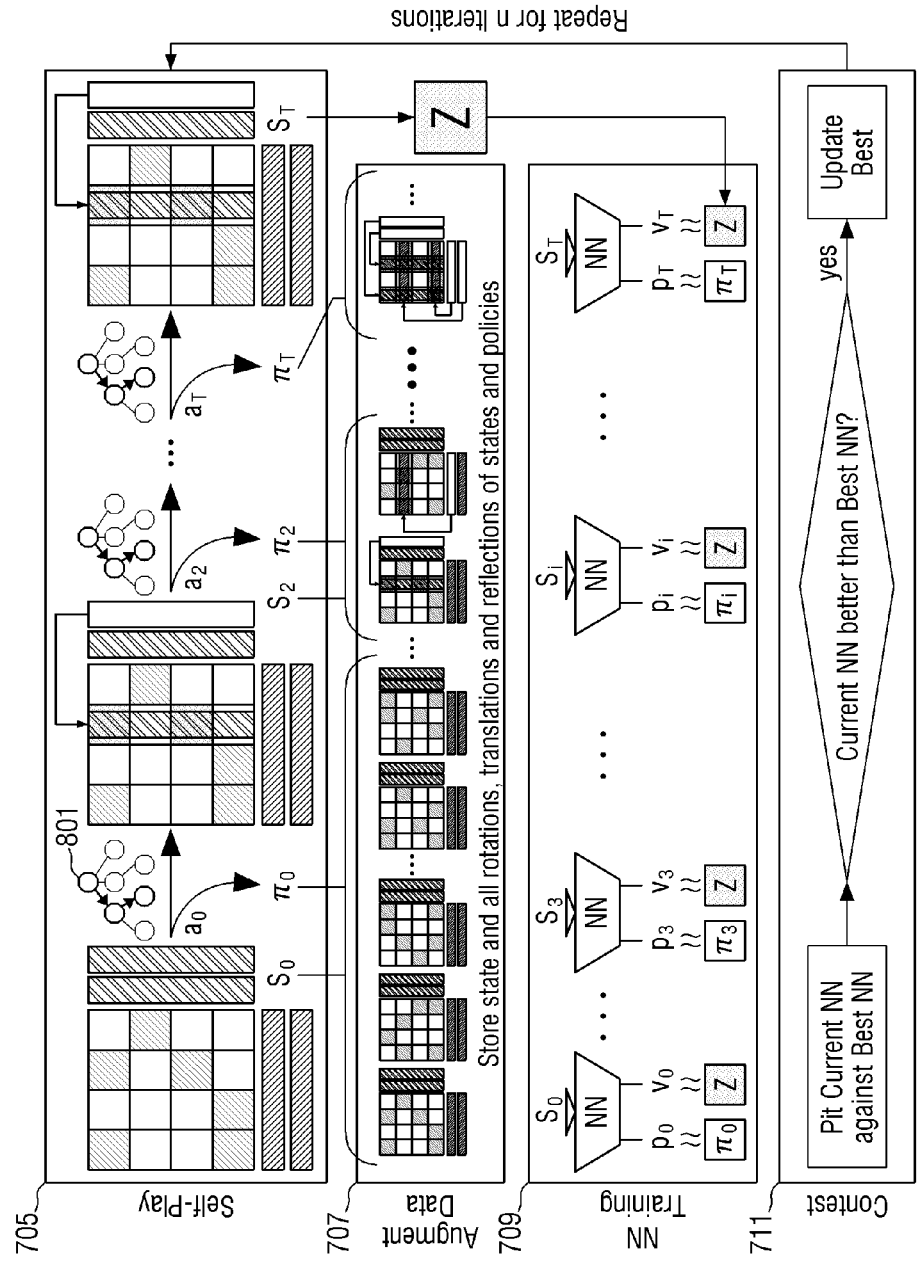
FIG. 8 illustrates a training pipeline of the RA process, according to an embodiment of the present disclosure.

As explained above, the main object of the disclosure is that a maximum number of faulty memory cells is reparable and a minimum number of SC and SR are utilized during the repairing. This is achievable when the NN or the AlphaRA agent is trained such that the during the training process a best NN is selected for repairing the faulty memory cells and the actions taken by the selected best NN are such that the maximum number of faulty memory cells is reparable and the minimum number of SC and SR are utilized. The training process includes:
  a) Self-play process
  b) Data Augmentation
  c) NN training Referring to the FIG. 7(A), the method 700a initially includes defining the RA environment 303 at step 701. The step 701 corresponds to the step 401, thus for the sake of brevity a detail explanation has been excluded here. After defining the RA environment 303, the method 700a then proceed to step 703, where it was determined that whether an iteration limit has reached to a predefined number of iterations associated with the RA training process. The predefined number of iterations is being set by the user or its default settings. Now if the iteration is within the limit of predefined number of iterations, the process 700a moves to step 705 to perform the self-play process. FIG. 8 illustrates a training pipeline of the RA process, according to an embodiment of the present disclosure.

Accordingly, in general, the self-play process a current memory state of the faulty memory cells 101 is being input to a Monte Carlo Tree Search (MCTS) 801. Thereafter, each time (step t) the action for repairing the faulty memory cells is performed, MCTS simulations on the inputted current memory state of the faulty memory cells is being performed. Thereafter, a result of the performed MCTS simulation each time the action for repairing the faulty memory cells is stored as a tuple. According to an embodiment, the tuple (s, $\pi_t$, z) includes a one or more of variables including the current the memory state, each of a policy of the memory state and a terminal reward returned in response to the MCTS simulations. Further, the policy of the memory state corresponds to a change in a probability distribution associated with the current memory state.

According to an embodiment, in particular, the self-play episode consists of the repair process of a single chip. In each iteration, a number of self-play episodes are carried out. For each time step t of repair, a number of MCTS simulations are performed starting from the current state st and an improved policy $\pi t$ is returned. The estimates obtained from MCTS are then used as new targets to subsequently train the DNN and get improved policy and value functions.

The DNN $f_\theta$, parameterized by $\theta$, is trained from the dataset collected from self-play. It takes the state of the chip ( ) as input and has two outputs: a value of state $v(s) \in [-1, 1]$ and a vector of action probabilities $p_\theta$ (s). The DNN is initialized to random weights, thus the initial policy $p_\theta$ is also random. For each state s, an MCTS search is executed, guided by the DNN f. The DNN acts as the predictor. The actions in MCTS are selected according to the PUCT formula (5) until a leaf node is encountered. Once a leaf node s' is encountered, it evaluates the node by using the DNN to predict a policy and a value ($p_\theta(s')$, $v(s')$) for this node. Instead of performing a rollout from s', it backpropagates $v(s')$ and updates the Q and N values of all nodes along the current simulation path. If instead, we come across a terminal state during the search, we propagate the actual reward z, i.e. +1 if the chip is repaired and −1 otherwise. The MCTS outputs a vector of action probabilities $\pi$, which is generally much stronger than the DNN policy $p_\theta$.

The data generated from each time step t of a self-play episode is stored as a tuple (s, $\pi_t$, z) where z is the reward at the end of the episode. This data is inserted in a replay buffer queue of a fixed length. Since successive states are strongly correlated, we do a random uniform sampling from the replay buffer in order to train the DNN. The objective is to minimize the Mean Squared Error between the predicted value v and the target z and to maximize the similarity between predicted neural network policy $p\theta$ and target MCTS policy $\pi$ by minimizing the cross-entropy loss. The combined loss function, $\ell$ is defined as:

$$\ell = (z-v)^2 - \pi^T \cdot \log(p) \qquad (1)$$

Thus, the MCTS drives the DNN to output better policies, which in turn guides the MCTS to search the action space more efficiently, and iteratively increases the overall strength of the algorithm.

After the self-play process the method 700a, perform data argument at step 707. Accordingly, data argument includes augmenting an output of the self-play process. As an example, the augmentation of the output of the self-play process includes rotation, swapping, and flipping operations on the output of the self-play process. Since rotating, swapping, flipping operations do not affect the repairability of the chip, the data augmented obtained from self-play so that the DNN has a richer dataset to learn from.

Accordingly, the data argument at step 707 includes rotating the memory state at a specific angle such that remaining SR or SC is interchanged with each other or remain unchanged. The specific angle may include 90, 180, 270, 360 degrees. FIG. 9A illustrates an example of the rotation operation, according to an embodiment of the present disclosure. An 8×8 chip rotated by 90 degrees which leads to rotation of the faulty memory, exchanging of spares and the action probabilities being assigned accordingly.

Figure 9B:
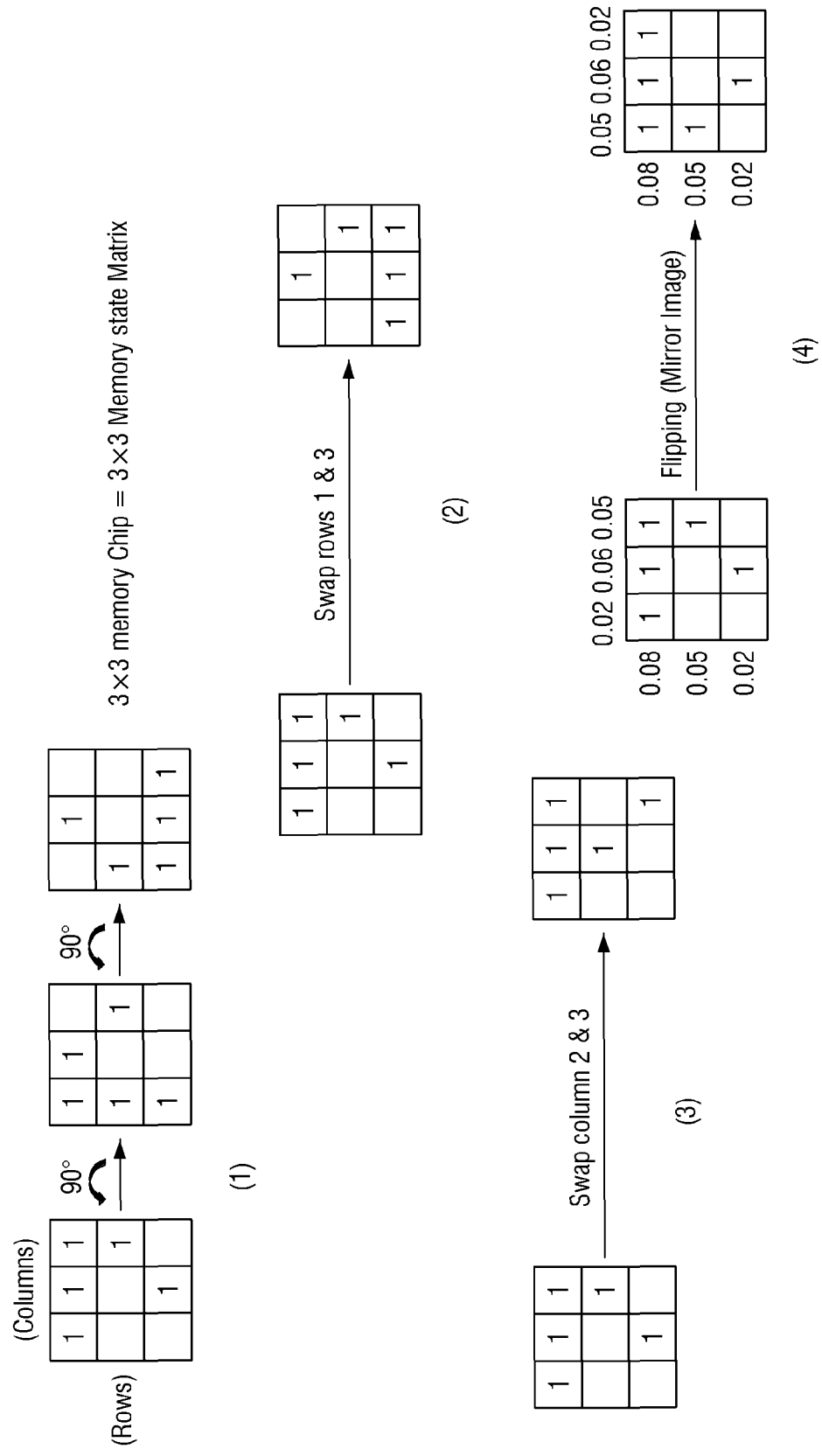
FIG. 9B shows another example of the various operation of the data augmentation process, according to an embodiment of the present disclosure.

FIG. 9B shows another example of the various operation of the data augmentation process. Referring to the FIG. 9B-1 when the memory state is rotated by 90 degrees, rows of the Memory state become columns and columns of the memory state become rows, so SR become SC for the rotated state and SC become SR for the rotated state and the policy vector will also change. For example, if a memory state is rotated by 90 degrees anticlockwise, then the policy Vector of original state [r1, r2, r3, c1, c2, c3] will change to [c3, c2, c1, r1, r2, r3] i.e. Policy Vector of 90 Rotated state. As a further example, when the memory state is rotated by 180 degrees, SR and SC remain same and will NOT be interchanged but policy vector will change. For example, if a memory state is rotated by 180 degrees anticlockwise then the policy Vector of original state [r1, r2, r3, c1, c2, c3] will change to [r3, r2, r1, c3, c2, c1] i.e. Policy Vector of 180 Rotated state. As yet further example, when the memory state is rotated by 270 degrees, SR and SC will be interchanged and policy vector will also change (not shown in the figures). For example, if a memory state is rotated by 270 degrees anticlockwise then the policy vector of the original state [r1, r2, r3, c1, c2, c3] will change to [c1, c2, c3, r3, r2, r1] i.e. Policy Vector of 270 Rotated state.

Figure 2:
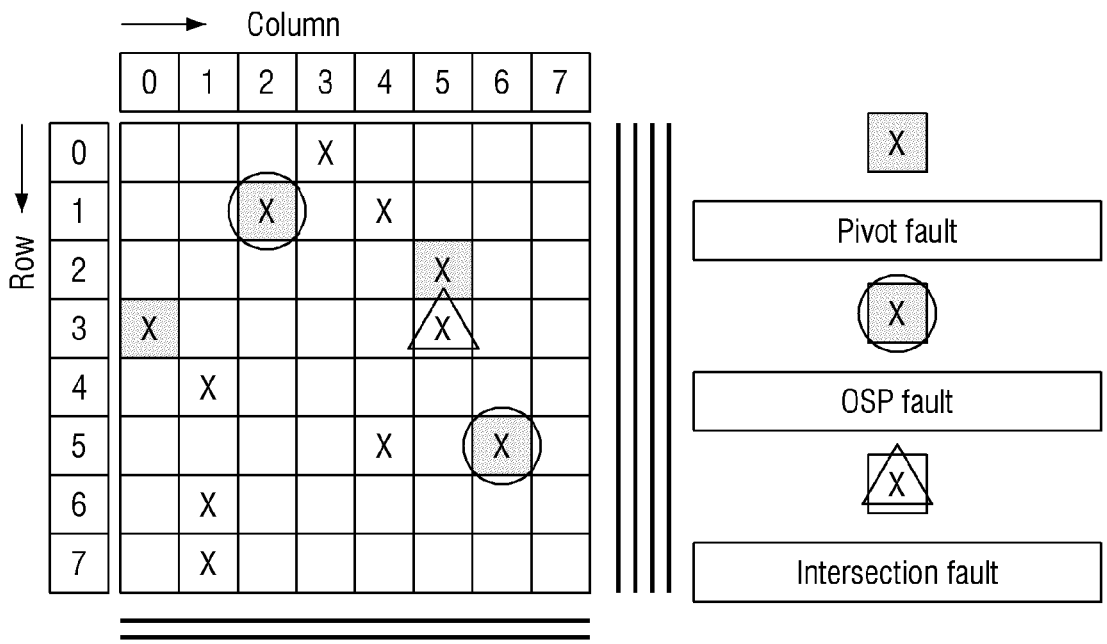
FIG. 2 is an example diagram illustrating classification of the faults in accordance with an existing solution.

Accordingly, the data argument further includes swapping at least one row with another row or at least one column with another column such that the number of SR and SC remains same for respective swapped state after the swapping. Swapping is an operation where the swapping is swapping the positions of two rows in between themselves or swap the positions of two columns in between themselves. Referring to the FIG. 9B-2 and the FIG. 9B-3, when Row 1 and Row 3 is swap, the Number of SR and SC will remain the same for the Swapped state. However, the Policy vector will change as follows Policy Vector of Original state [r1, r2, r3, c1, c2, c3]→[r3, r2, r1, c1, c2, c3] i.e Policy Vector of Swapped state. Further, when Col 2 and Col 3 is swap, the Number of SR and SC will remain the same for the Swapped state. However, the Policy vector will change. Thus, the Policy Vector of Original state [r1, r2, r3, c1, c2, c3]→[r1, r2, r3, c1, c3, c2] i.e Policy Vector of Swapped state.

Accordingly, the data argument further includes flipping the memory state corresponding to the one or more faulty memory cells such that the number of SR and SC remains same for flipped state after the flipping. Again, referring to the FIG. 9B-4 when the memory state is flipped, the number of SR and SC will remain the same for the Flipped state. However, the Policy vector will change as follows Policy Vector of Original state [r1, r2, r3, c1, c2, c3]→[r1, r2, r3, c3, c2, c1] i.e. Policy Vector of Flipped state.

The training process after data augmentation proceeds to step 709 to perform the NN training. Accordingly, the method 700a further includes training the first NN based on the augmented output of the self-play process to obtain a second NN. As an example, the first NN is a current NN and the second NN is a new NN. One or more training is provided to the first NN.

According to an embodiment, during the NN training an error is being calculated based on a sum of an error value in the policy of the memory state and an error value in the value of the memory state. In an implementation, the error value in the policy of the memory state is a cross entropy loss between policy vector outputted by the current NN and a policy vector is obtained based on a MCTS simulation that is performed on the current memory state. The error value in the value of the memory state is a means squared error between a value obtained from the current NN and the reward obtained from the MCTS simulation.

Thus, mathematically the error (l) as show in the equation (1) is given by:

$$\text{Error } (l) = \text{Error of Policy } (-\pi^T \cdot \log(p)) + \text{Error of Value } (z-v)^2 \quad (2)$$

$$\text{Error of Policy} = (-\pi^T \cdot \log(p)) \quad (3)$$

Where, p—policy vector outputted by Neural Network,
π—policy vector obtained from MCTS (acting as ground Truth)

$$\text{Error of Value} = (z-v)^2 \quad (4)$$

Where v—value outputted by Neural Network,
z—value (reward) obtained from MCTS (acting as Ground Truth)

After, the NN training process, the method 700a further includes performing a contest at step 711. Accordingly, the method includes performing the contest process by comparing outputs results of the first NN with the second NN. In an implementation, the comparison is performed till a value of specific number of training iterations is less than value of a predefined number of iterations associated with the RA training process as explained in the beginning. Thus, during the contest a comparison is done between two NN. Thereafter, at step 713 it was determined is the current NN is better than the best NN and accordingly, the current NN will then updated with the best NN for the next iteration. Accordingly, the AlphaRA agent selects, from one of the first NN or the second NN as the current NN based on a result of the comparison between the first NN and the second NN during the contest process. Further, the contest process is performed based on a heuristic mechanism.

In an implementation, the process of choosing the best trained neural network includes choosing a fixed number of chips from a validation set, and providing these chips to the best and the current neural network with the conditions to choose the best out of the two neural networks. Given that both are able to repair the chips, the network with least spare utilization is the winner, else it is a draw. Given both are not able to repair, the network with the least number of faults remaining is the winner, else it is a draw. Further, given that one is able to repair the chip and the other fails to do so, the network repairing the chip is the winner. The winner NN will be chosen as best NN for the next iteration.

Accordingly, a spare utilization as a criterion along with repair rate is used, to determine the performance of an agent. This is because an algorithm that uses fewer spares is preferred as spares saved can be used further in the manufacturing process. If the current agent beats the best agent by a certain threshold, the best model is updated. The next iteration of AlphaRA self-play starts after the contest phase.

FIG. 7(B) illustrates a testing process for repairing the memory device, according to an embodiment of the present disclosure. In the testing process 700b, initially at step 721 a new chip is given for repair to the hardware system as shown in the FIG. 10. Thereafter, an action is taken by the AlphaRA based on the process as discussed above at step 723. Then, at step 723, it was determined are any faults are remaining to repair. This step 723 corresponds to 407 of FIG. 4. If the faults is found to be remaining then its was determined at step 727 are there any SR or SC is left. If yes then the process again proceed to the block 723 until all the maximum number of faulty memory cells is reparable and the minimum number of SC and SR are utilized during the repairing is achieved. If the no faults are found then it was determined that the chip is repaired at step 729. Further, if SR or SC are found then it was determined that the chip is unrepaired 730.

FIG. 10 is a diagram illustrating the configuration of a hardware system 1000, according to an embodiment of the present disclosure. The configuration of FIG. 10 may be understood as a part of the configuration of the any hardware system. Hereinafter, it is understood that terms including "unit" or "module" at the end may refer to the unit for processing at least one function or operation and may be implemented in hardware, software, or a combination of hardware and software.

Referring to FIG. 10 hardware system 1000 may include at least one processor 1002, a and a memory unit 1004 (e.g., storage). As an example, the processor 1002 may be a single processing unit or a number of units, all of which could include multiple computing units. The processor 1002 may be implemented as one or more microprocessors, microcomputers, microcontrollers, digital signal processors, central processing units, state machines, logic circuitries, and/or any devices that manipulate signals based on operational instructions. Among other capabilities, the processor 1002 is configured to fetch and execute computer-readable instructions and data stored in the memory. The processor 1002 may include one or a plurality of processors. At this time, one or a plurality of processors 1002 may be a general-purpose processor, such as a central processing unit (CPU), an application processor (AP), or the like, a graphics-only processing unit such as a graphics processing unit (GPU), a visual processing unit (VPU), and/or an AI-dedicated processor such as a neural processing unit (NPU). The one or a plurality of processors 1002 may control the processing of the input data in accordance with a predefined operating rule or artificial intelligence (AI) model stored in the non-volatile memory and the volatile memory, i.e., memory unit 1004. The predefined operating rule or artificial intelligence model is provided through training or learning.

The memory unit 1004 may include any non-transitory computer-readable medium known in the art including, for example, volatile memory, such as static random access memory (SRAM) and dynamic random access memory (DRAM), and/or non-volatile memory, such as read-only memory (ROM), erasable programmable ROM, flash memories, hard disks, optical disks, and magnetic tapes or any memory devices.

According to a present disclosure, performance of the disclosed approach is compared with existing algorithms such as OSP and LECA. For a 16×16 chip, with just 2 MCTS simulations and 15 training iterations (~5 hours), it starts to outperform LECA and OSP. The best model is found in the 76th iteration (~51 hours) and has ~97% normalized repair rate.

Further, performance of the disclosed approach is compared with existing algorithms such as broadside, FLCA, LECA and OSP for different error. Out of 50000 test dataset of 16×16 chips, 35159 chips were theoretically repairable. Broadside, LECA, and OSP were able to repair 9789, 33063, and 33185 chips respectively while AlphaRA with 32 MCTS simulations was able to repair 35090 chips, achieving an average normalized repair rate of 99.8%, which is 5.4% more than the next best algorithm LECA.

Further, with an average total spare utilization of 7.107, the disclosed approach has the least spare utilization compared to all the algorithms under consideration. OSP gives a higher preference to spare columns whereas LECA gives a higher preference to spare rows. This leads to these algorithms exhausting either spare rows or columns quickly resulting in a lower normalized repair rate. The disclosed approach gives approximately equal preference to spare rows and columns (~3.5), achieving a much higher normalized repair rate. Further, according to the disclosed approach a unique chips solved by AlphaRA are chips that are solved or repaired by AlphaRA and not repaired by other heuristic algorithms. Further, the disclosed approach for AlphaRA maintains a normalized repair rate above 97% across all the chip sizes under consideration.

As would be apparent to a person in the art, various working modifications may be made to the method in order to implement the inventive concept as taught herein.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not necessarily limited to the manner described herein.

Moreover, the actions of any flow diagram need not be implemented in the order shown; nor do all of the acts necessarily need to be performed. Also, those acts that are not dependent on other acts may be performed in parallel with the other acts.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein.

Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component of any or all the claims.

We claim:

1. A method for repairing a memory device, comprising:
    detecting one or more faulty memory cells that are faulty in a memory device and a location corresponding to each of the one or more faulty memory cells;
    defining a Redundancy Analysis (RA) environment, comprising the detected location of each of the one or more faulty memory cells and a plurality of spare rows (SRs) and a plurality of spare columns (SC), for repairing the memory device;
    repairing each of the one or more faulty memory cells based on an RA training process using the defined RA environment and mapping of the detected location of each of the one or more faulty memory cells with the plurality of SRs or SCs;
    determining whether at least one faulty memory cell among the one or more faulty memory cells is left unrepaired after the repairing of the one or more faulty memory cells;
    determining whether any SR or SC among the plurality of SRs or SCs is remaining based on the determination that the least one faulty memory cell among the one or more faulty memory cells is left unrepaired; and
    training, based on the determination that indicates the at least one faulty memory cell is left unrepaired and at least one of the plurality of SRs or SCs is remaining, a first neural network (NN) such that the first NN performs an action for repairing of the one or more faulty memory cells, wherein the action is performed such that a maximum number of faulty memory cells is reparable and a minimum number of SRs and SCs are utilized during the repairing.

2. The method as claimed in claim 1, wherein the determination of whether at least one faulty memory cell is left unrepaired is based on a reward returned during the repairing,
wherein the performed action is based on a policy of a memory state and a memory state corresponding to the one or more faulty memory cells and wherein the reward is based on a presence of a set of faulty memory cells among the one or more faulty memory cells and a number of available SRs or SCs after the action is performed.

3. The method as claimed in claim 2, wherein the training of the first NN includes:
performing a self-play process on the defined RA environment;
augmenting an output of the self-play process;
training the first NN based on the augmented output of the self-play process to obtain a second NN, wherein the first NN is a current NN and the second NN is a new NN; and
performing a contest process by comparing outputs results of the first NN with the second NN.

4. The method as claimed in claim 3, wherein a plurality of the training process is provided to the first NN for repairing of the faulty memory cells.

5. The method as claimed in claim 3, wherein the comparison is performed till a value of specific number of training iterations is less than value of a predefined number of iterations associated with the RA training process.

6. The method as claimed in claim 3, wherein the augmentation of the output of the self-play process includes:
rotating the memory state at a specific angle such that remaining SR or SC is interchanged with each other or remain unchanged;
swapping at least one row with another row or at least one column with another column such that the number of SRs and SCs remains same for respective swapped state after the swapping; and
flipping the memory state corresponding to the one or more faulty memory cells such that the number of SRs and SCs remains same for flipped state after the flipping.

7. The method as claimed in claim 3, further comprising:
selecting, as the current NN, from one of the first NN or the second NN based on a result of the comparison between the first NN and the second NN during the contest process, wherein the contest process is performed based on a heuristic mechanism.

8. The method as claimed in claim 3, wherein for performing the self-play process, the method further comprising:
inputting a current memory state of the one or more faulty memory cells to a Monte Carlo Tree Search (MCTS);
performing, each time (step t) the action for repairing the one or more faulty memory cells is performed, MCTS simulations on the inputted current memory state of the one or more faulty memory cells; and
storing, as a tuple, a result of the performed MCTS simulation each time the action for repairing the one or more faulty memory cells is performed,
wherein the tuple includes a plurality of variables including the current the memory state, each of a policy of the memory state and a terminal reward returned in response to the MCTS simulations,
wherein the policy of the memory state corresponds to a probability distribution associated with the current memory state.

9. The method as claimed in claim 1, further comprising:
determining, each time the action for repairing the one or more faulty memory cells is performed, whether any SR or SC among the plurality of SRs or SCs is remaining,
determining a must-repair condition for repairing the one or more faulty memory cells based on the determination that indicates an availability of any SR or SC among the plurality of SRs or SCs after each performed action for repairing of the one or more faulty memory cells,
wherein the must repair condition for a row or a column is defined as a number of faults in a row or column exceeding an available number of SRs or SCs, respectively.

10. The method as claimed in claim 9, further comprising:
identifying a first set of memory line among the one or more faulty memory cell in a case where the number of faults in the row or column exceeds the available number, respectively; and
masking identified the first set of faulty memory line when the must-repair condition is satisfied, wherein a memory line includes faulty rows and faulty columns.

11. The method as claimed in claim 1, the method comprising:
determining, each time the action for repairing the one or more faulty memory cells is performed, whether any SR or SC among the plurality of SRs or SCs is remaining, determining an occurrence of a must-repair condition for repairing the one or more faulty memory cells based on the determination that indicates an availability of any SR or SC among the plurality of SRs or SCs after each performed action for repairing of the one or more faulty memory cells; and
masking a second set of memory cells other than the one or more faulty memory cells, wherein the second set of memory cells has zero faults.

12. The method as claimed in claim 3, further comprising:
calculating an error based on a sum of an error value in the policy of the memory state and an error value in the value of the memory state,
wherein the error value in the policy of the memory state is a cross entropy loss between policy vector outputted by the current NN and a policy vector is obtained based on a MCTS simulation that is performed on the current memory state, and
wherein the error value in the value of the memory state is a means squared error between a value obtained from the current NN and the reward obtained from the MCTS simulation.

13. A system for repairing a memory device comprising: one or more processors and a memory that includes one or more faulty memory cells, wherein the one or more processors are configured to:
detect one or more faulty memory cells that are faulty in a memory device and a location corresponding to the each of one or more faulty memory cells;
define a Redundancy Analysis (RA) environment, comprising the detected location of the each of one or more faulty memory cells and a plurality of spare rows (SRs) and a plurality of spare columns (SCs), for repairing the memory device;

repair each of the one or more faulty memory cells based on an RA training process using the defined RA environment and mapping of the detected location of each of the one or more faulty memory cells with the plurality of SRs or SCs;

determine whether at least one faulty memory cell among the one or more faulty memory cells is left unrepaired after the repairing of the one or more faulty memory cells;

determine whether any SR or SC among the plurality of SRs or SCs is remaining based on the determination that the least one faulty memory cell among the one or more faulty memory cells is left unrepaired; and train, based on the determination that indicates the at least one faulty memory cell is left unrepaired and at least one SR or SC is remaining, a first neural network (NN) such that the first NN performs an action for repairing of the one or momre faulty memory cells, wherein the action is performed such that a maximum number of one or more faulty memory cells is reparable and a minimum number of SRs and SCs are utilized during the repairing.

\* \* \* \* \*